(12) United States Patent
Karlquist

(10) Patent No.: US 8,718,590 B2
(45) Date of Patent: May 6, 2014

(54) DOWNCONVERSION OF COMB SPECTRUM

(71) Applicant: Agilent Technologies, Inc., Loveland, CO (US)

(72) Inventor: Richard K. Karlquist, Cupertino, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/712,262

(22) Filed: Dec. 12, 2012

(65) Prior Publication Data

US 2013/0225110 A1     Aug. 29, 2013

Related U.S. Application Data

(60) Provisional application No. 61/602,231, filed on Feb. 23, 2012.

(51) Int. Cl.
*H04B 1/26* (2006.01)
(52) U.S. Cl.
USPC ........... 455/313; 455/130; 455/139; 455/316; 455/318
(58) Field of Classification Search
CPC ........... H04B 1/06; H04B 1/26; H04B 17/004
USPC ............. 455/130, 76, 139, 141, 165.1, 168.1, 455/226.1, 230, 255, 313, 316, 318, 323
See application file for complete search history.

(56) References Cited

U.S. PATENT DOCUMENTS

| | | | |
|---|---|---|---|
| 4,843,638 A | 6/1989 | Walters | |
| 5,451,910 A | 9/1995 | Guthrie | |
| 5,508,661 A * | 4/1996 | Keane et al. | 331/37 |
| 6,333,679 B1 | 12/2001 | Eriksson | |
| 2008/0025439 A1 * | 1/2008 | Al-Eidan | 375/334 |
| 2008/0056337 A1 | 3/2008 | Tal et al. | |
| 2011/0059714 A1 * | 3/2011 | Collins et al. | 455/296 |

* cited by examiner

*Primary Examiner* — Tuan Pham

(57) ABSTRACT

A downconverter mixes a first comb spectrum with a local oscillator signal to generate a second comb spectrum in a lower frequency range. The first comb spectrum comprises frequency components separated from each other according to a frequency spacing interval, and the LO signal has a frequency offset relative to the first comb spectrum, where the frequency offset is a rational fraction of the frequency spacing interval. The second comb spectrum comprises lower and upper sideband responses corresponding to respective lower and upper sideband signals of the first comb spectrum. The lower and upper sideband responses in the second comb spectrum can be distinguished from each other based on the frequency offset.

20 Claims, 10 Drawing Sheets

DOWNCONVERSION OF COMB SPECTRUM

CROSS-REFERENCE TO RELATED APPLICATIONS

The present application claims priority under 35 U.S.C. §119(e) from U.S. Patent Provisional Application No.: 61/602,231 entitled "Downconversion of Comb Spectrum," naming Richard K. Karlquist as inventor, and filed on Feb. 23, 2012, The disclosure of this provisional application is specifically incorporated herein by reference.

BACKGROUND

When making measurements in radio frequency (RF) range, a set of signals at equally spaced frequency intervals (referred to as a "comb spectrum") are often analyzed. For example, a network analyzer may excite a device under test (DUT) using a comb spectrum and then analyze the DUT's response to the comb spectrum. The DUT's response is typically another comb spectrum in which individual frequency components of the original comb spectrum are attenuated, amplified, and/or phase shifted according to the DUT's electrical characteristics.

To analyze the DUT's response, it may be necessary to downconvert the comb spectrum to a lower frequency range compatible with signal analysis circuitry. For instance, when analyzing a DUT using a comb spectrum in a higher frequency range (e.g., comparatively high gigahertz frequency range), it may be necessary to downconvert the comb spectrum to a lower frequency range (e.g., a lower gigahertz frequency range or a megahertz frequency range). This downconversion can be performed, for example, using a superheterodyne receiver.

FIG. 1 shows a known system that excites a DUT using an input comb spectrum (or test comb spectrum) and then downconverts a resulting output comb spectrum (or response comb spectrum) for analysis.

Referring to FIG. 1, a system 100 comprises a network analyzer 105, a DUT 110, and a downconverter 115. Network analyzer 105 uses a comb synthesizer to generate a comparatively high frequency input comb spectrum for DUT 110. DUT 110 receives the input comb spectrum and responds by producing a comparatively high frequency output comb spectrum. Downconverter 115 downconverts the output comb spectrum from the comparatively high frequency to a lower, intermediate frequency (IF) compatible with signal analysis circuitry in network analyzer 105, and transmits the downconverted output comb spectrum to the signal analysis circuitry.

In certain known test systems, the downconversion of a comb spectrum may also produce problems resulting in ambiguities in the downconverted comb spectrum. These problems include so-called "image response" and so-called "harmonic mixing". Image response occurs when two frequency components in the input comb spectrum are equidistant from a frequency of a local oscillator (LO) signal, so they map to a single frequency component in the output comb spectrum. Harmonic mixing, on the other hand, occurs when two frequency components in the input comb spectrum mix with two different harmonic components of the LO signal such that they map to the same frequency component in an output comb spectrum.

FIG. 2 shows an example of image response. In FIG. 2, a mixer 200 mixes an LO signal 210 having a frequency of 10 MHz with an input comb spectrum 205 having frequency components at 9 MHz, 10 MHz, and 11 MHz. This mixing produces an output comb spectrum 215. As illustrated by a dotted arrow in FIG. 3, the 9 MHz component and the 11 MHz component of input comb spectrum 205 both mix with the 10 MHz LO signal 210 to produce a component at 1 MHz in output comb spectrum 215. In other words, the 9 MHz and 11 MHz components both map to the same frequency component, as indicated by a dotted arrow. This creates an ambiguity in output comb spectrum 215, making it difficult if not impossible to distinguish the downconverted 9 MHz component from the downconverted 11 MHz component.

Because the 9 MHz signal is lower than the 10 MHz LO signal, the 9 MHz signal is referred to as a "lower sideband" signal and the corresponding mixing product of the 9 MHz signal is referred to as a "lower sideband" response. Similarly, because the 11 MHz signal is higher than the 10 MHz LO signal, the 11 MHz signal is referred to as an "upper sideband" signal and the corresponding mixing product of the 11 MHz signal is referred to as an "upper sideband" response.

FIG. 3 shows an example of harmonic mixing. In FIG. 3, a mixer 300 mixes an LO signal 310 having a frequency of 10 MHz with an input comb spectrum 305 having frequency components at 9 MHz and 31 MHz. This results in an output comb spectrum 315.

In addition, mixer 300 has a harmonic response, meaning that the mixer 300 mixes the harmonics of LO signal 310 with comb spectrum 305. In FIG. 3, the second and third harmonics of LO signal 310 are shown in parentheses to distinguish them from LO signal 310, which is used to drive mixer 300. In this example, the 9 MHz input signal mixes with the 10 MHz LO signal to produce an output component at 1 MHz, and the 31 MHz input signal mixes with the 30 MHz harmonic of LO signal 310 to produce an output component at 1 MHz as well, as indicated by a dotted, arrow. Accordingly, the 9 MHz and 31 MHz components both map to the same frequency component, creating an ambiguity in output comb spectrum 315.

Although FIGS. 2 and 3 illustrate the problems of image response and harmonic mixing with discrete frequency components, these problems also arise in superheterodyne receivers that use a "block downconverter" configuration. In superheterodyne receivers, a band of input frequencies is converted simultaneously as a block to a comparatively lower band of frequencies. For example, an input band of 8 MHZ to 9 MHz could be mixed with 10 MHz signal to yield an output (IF) band of 1 MHz to 2 MHz.

In conventional superheterodyne receivers, the problems of image response and harmonic mixing are typically addressed, through the use of a preselector, which is a tunable filter that passes one band of frequencies at a time to be received, The preselector may comprise, for instance, a bandpass or notch filter that eliminates unwanted frequencies from the input signal. This prevents two input components from simultaneously mapping to the same output component, so spurious components can be removed from a DUT response.

Unfortunately, a preselector is typically a fairly expensive, complex subassembly that cannot be implemented on an integrated circuit (IC). For example, an Yttrium-Iron-Garnet (YIG) filter is often used, at substantial cost and complexity.

In view of the foregoing, there is a need for superheterodyne receivers that can achieve reliable performance without the use of preselectors.

SUMMARY

In a representative embodiment, a method comprises: receiving a first comb spectrum comprising a plurality of frequency components separated from each other according to a frequency spacing interval; receiving a local oscillator (LO) signal having a frequency offset relative to the first comb spectrum, wherein the frequency offset is a rational fraction of the frequency spacing interval and is less than one; mixing the first comb spectrum with the LO signal to generate a second comb spectrum, wherein the second comb spectrum comprises lower and upper sideband responses corresponding to respective lower and upper sideband signals of the first comb spectrum; and distinguishing between the lower and upper sideband responses in the second comb spectrum based on the frequency offset In another representative embodiment, system comprises a downconverter configured to mix a first comb spectrum and a local oscillator (LO) signal to produce a second comb spectrum. The first comb spectrum is characterized by a frequency spacing interval, the LO signal has a frequency offset relative to the first comb spectrum, where the frequency offset is a rational fraction of the frequency spacing interval and is less than one. The second comb spectrum comprises lower and upper sideband responses corresponding to respective lower and upper sideband signals of the first comb spectrum. The system comprises a signal analysis circuit configured to distinguish between the lower and upper sideband responses of the second comb spectrum based on the frequency offset.

BRIEF DESCRIPTION OF THE DRAWINGS

The described embodiments are best understood from the following detailed description when read with the accompanying drawing FIGS. Wherever applicable and practical, like reference numerals refer to like elements.

DETAILED DESCRIPTION

Figure 1:
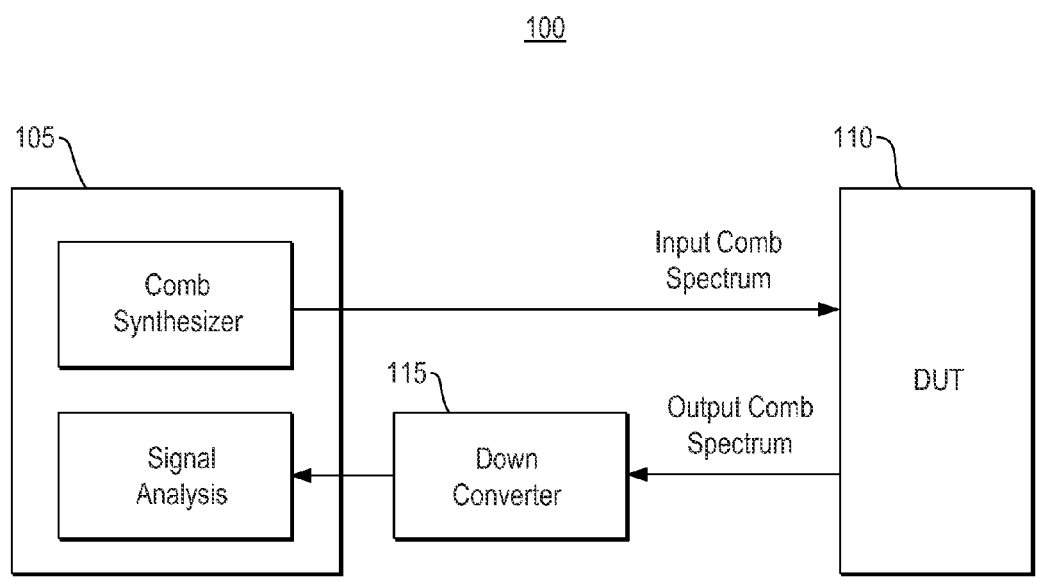
FIG. 1 is a block diagram of a known network analyzer configured to analyze a DUT using a comb spectrum.
Figure 2:
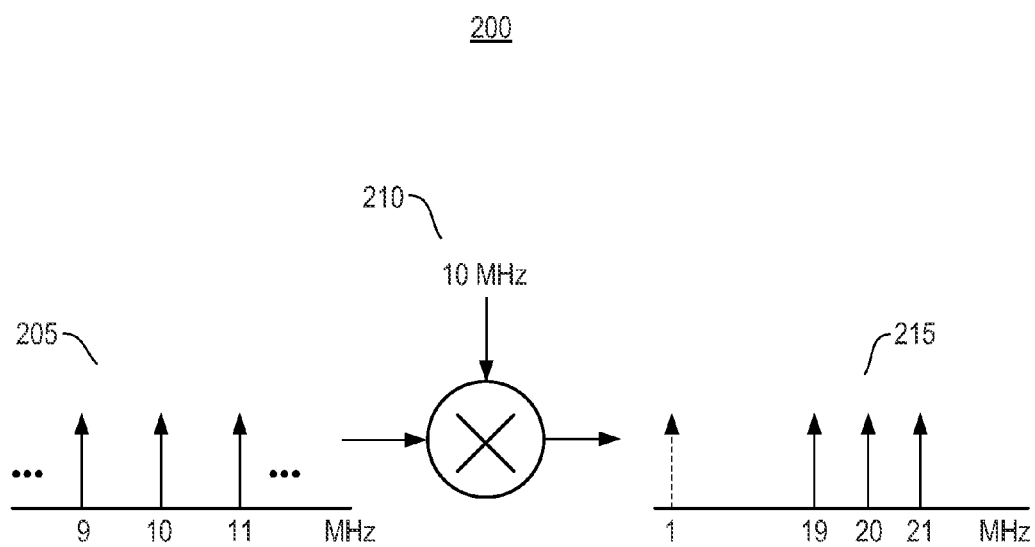
FIG. 2 is a diagram illustrating the problem of image response in a known downconverter such as a known superheterodyne receiver.

In the following description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claim set. Moreover, descriptions of well-known apparatuses and methods maybe omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The described embodiments relate generally to block downconversion of a comb spectrum. These embodiments can be implemented, for instance, to downconvert an output comb spectrum of DUT that has been excited by a comparatively high frequency comb spectrum for test and measurement purposes.

The described embodiments find application in a variety of contexts when block downconversion is performed on a comb spectrum. Illustrative contexts include network analyzers or spectrum analyzers that perform signal testing in the microwave frequency range. However, the present teaching are contemplated for use in other instruments, or at different test frequency ranges, or both.

The representative embodiments described herein can perform downconversion without deleterious image response and harmonic mixing. This can potentially eliminate the need to filter the input comb spectrum using a preselector, or it can reduce the range of frequencies that need to be filtered by the preselector. Accordingly, the representative embodiments described below make it possible to construct a high performance superheterodyne receiver using block downconversion without having to resort to the use of a preselector.

In certain embodiments, the downconversion is performed by driving a frequency mixer with an LO signal that has a frequency offset that is a rational fraction less than one relative to a frequency spacing interval of the comb spectrum. For example, if an input comb spectrum has a frequency spacing interval of 1 MHz, the LO signal can have a fractional frequency offset of ⅓ MHz, ¼ MHz, ⅕ MHz, ⅐ MHz, etc.

Figure 4:
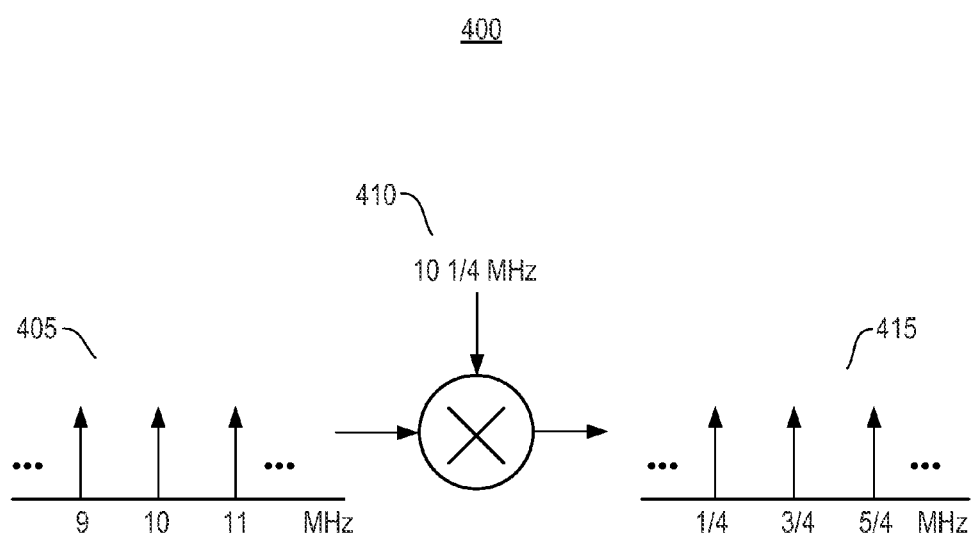
FIG. 4 is a diagram illustrating a method of downconverting a comb spectrum according to a representative embodiment.

FIG. 4 illustrates a method of downconverting a comb spectrum according to a representative embodiment. In this embodiment, the downconversion is performed by mixing the comb spectrum with an LO signal having a frequency offset equal to ¼ of the frequency spacing interval of the comb spectrum, Referring to FIG. 4, a frequency mixer 400 receives an input comb spectrum 405 (i.e., a first comb spectrum) and mixes it with an LO signal 410 to produce an output comb spectrum 415 (i.e., a second comb spectrum). Input comb spectrum 405 has frequency components at equally-spaced 1

MHz intervals (i.e. 1 MHz, 2 MHz, 3 MHz, 4 MHz, etc.). In other words, it has a frequency spacing interval of 1 MHz. LO signal 410 has a frequency of 10 ¼ MHz, and it is considered to have a frequency offset of ¼ MHz relative to input comb spectrum 405 because its frequency is offset by one-fourth of the frequency spacing interval (i.e., ¼ of 1 MHz) relative to one of the frequency components of input comb spectrum 405. More specifically, it is offset by ¼ relative to a 10 MHz component of input comb spectrum 405.

Figure 3:
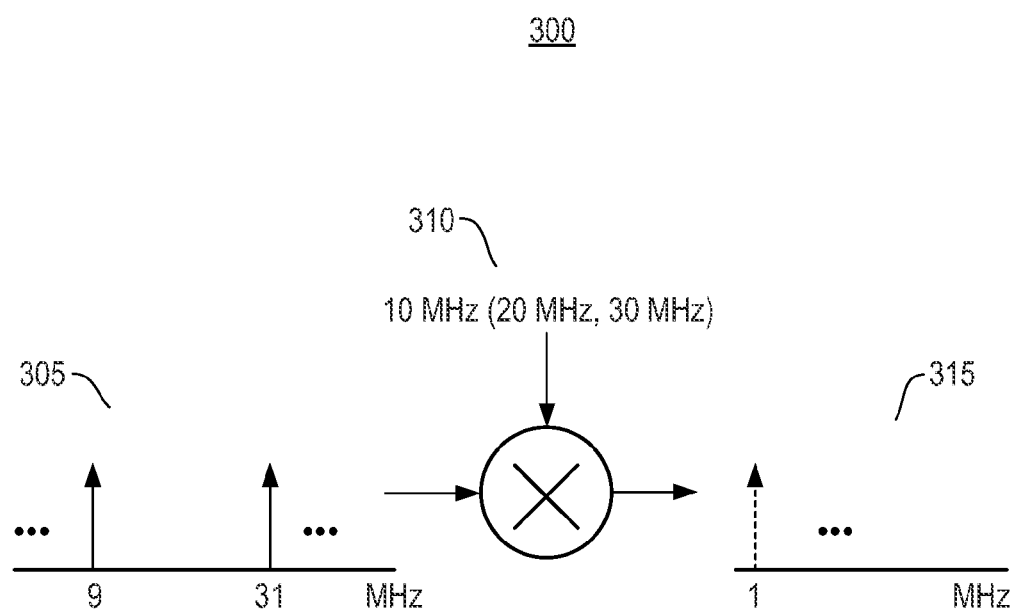
FIG. 3 is a diagram illustrating the problem of harmonic mixing in a known downconverter such as a known superheterodyne mixer.

Because of the ¼ frequency offset of LO signal 410, the lower sideband signals of input comb spectrum 405 (e.g., 10 MHz, 9 MHz, 8 MHz, etc.) convert to different IFs than the upper sideband signals of input comb spectrum 405 (e.g., 11 MHz, 12 MHz, 13 MHz, etc.). In other words, the lower sideband responses are different from the upper sideband responses. As an example, the 9 MHz component of input comb spectrum 405 mixes with the 10.25 MHz LO signal 410 to produce an IF of 1.25 MHz, and the 11 MHz component of input comb spectrum 405 mixes with the 10.25 MHz LO signal 410 to produce an IF of 0.75 MHz, Similarly, other lower sideband signals convert to IFs of 2.25 MHz, 3.25 MHz, 4.25 MHz, etc., and other upper sideband signals convert to IFs of 1.75 MHz, 2.75 MHz, 3.75 MHz, etc. Consequently, the ¼ frequency offset of LO signal 410 avoids the image response problem illustrated in FIG. 3.

Because the lower sideband responses are different from the upper sideband responses, a signal analysis circuit can distinguish between these responses in output comb spectrum 415 based on the frequency offset, This can be used, for instance, to generate a downconverted comb spectrum from output comb spectrum 415. For example, in one embodiment, a signal analysis circuit recovers the upper and lower sideband responses and rejects harmonic responses to generate the downconverted comb spectrum.

In general, the problem of image response can be avoided by incorporation of the present teachings using frequency offset that is a rational fraction less than one (e.g., 1/N, wherein N is an integer greater than 2). For example, LO signal 410 could have a frequency offset of ⅓, ¼, ⅕, ⅙, 1/7, etc. Moreover, an offset of M/N can produce results similar to 1/N, where M/N is a positive integer less than N (again, the offset is a rational fraction less than one). Accordingly, although the following description presents various embodiments using offsets of 1/N, similar performance could be achieved through the use of M/N offsets.

In the absence of image response, the upper and lower sideband responses may be independently identified in output comb spectrum 415, assuming there is no harmonic mixing. This identification can be performed, for instance, by a signal analysis circuit configured to receive and process output comb spectrum 415. Such a circuit is typically configured to identify the relevant responses based on stored or received information indicating the frequency offset, For instance, when frequency mixer 400 uses a ¼ frequency offset as in the example illustrated in FIG. 4, the signal analysis circuit may be configured to identity the lower sideband responses at equally spaced intervals of 1 MHz having a first offset (e.g., 0.25 MHz, 1.25 MHz, 2,25 MHz, etc.), and to identify the lower sideband responses at equally spaced intervals of 1 MHz having a second offset (e.g., 0.75 MHz, 1.75 MHz, 2.75 MHz, etc.).

Figure 5:
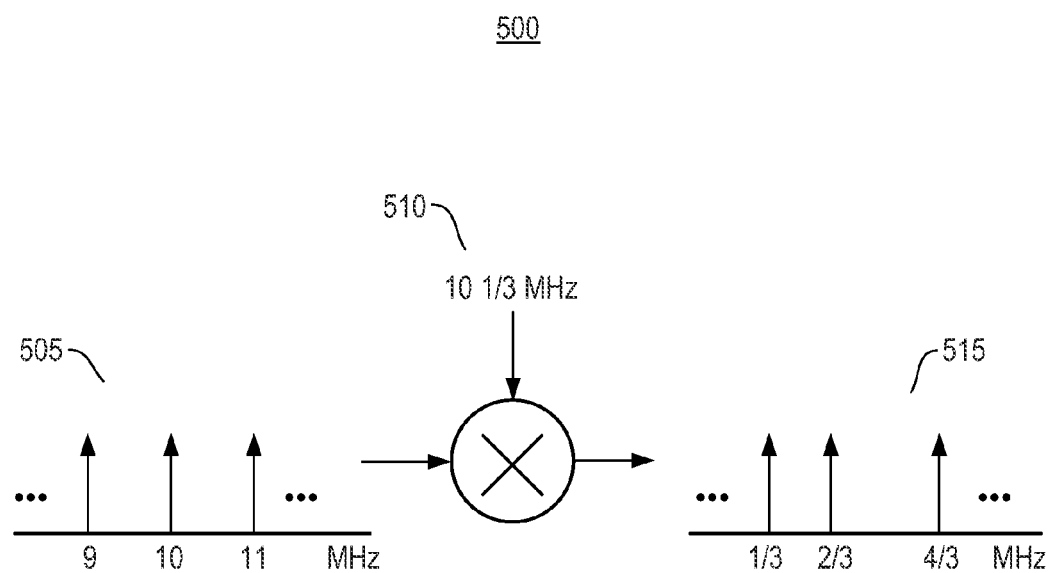
FIG. 5 is a diagram illustrating a method of downconverting a comb spectrum according to another representative embodiment.

FIG. 5 illustrates a method of downconverting a comb spectrum according to another representative embodiment. In this embodiment, the downconversion is performed by mixing the comb spectrum with an LO signal having a frequency offset equal to ⅓ of the frequency spacing interval of the comb spectrum.

Referring to FIG. 5, a frequency mixer 500 receives an input comb spectrum 505 and mixes it with an LO signal 510 to produce an output comb spectrum 515. Input comb spectrum 505 is substantially the same as input comb spectrum 405 of FIG. 4, but LO signal 510 differs from LO signal 410 in that it has a frequency offset of ⅓ MHz relative to input comb spectrum 505.

Due to the ⅓ frequency offset of LO signal 510, the lower sideband responses of input comb spectrum 505 do not experience image response from the upper sideband responses of input comb spectrum 505. For instance, the lower sideband signals are mixed to produce IF frequencies of 0.333 MHz, 1.333 MHz, 2.333 MHz, etc, while the upper sideband signals are mixed to produce IF frequencies of 0.667 MHz, 1.667 MHz, 2.667 MHz, etc.

Although the offsets of ¼ and ⅓, as illustrated in FIGS, 4 and 5 eliminate image response, these offsets do not necessarily prevent harmonic mixing. For example, if 10.25 MHz is used as the LO signal to drive a block downconversion mixer, it will also act as a 30.75 MHz drive signal and downconvert 30 MHz to 0.75 MHz. However, as will be explained below in relation to FIGS. 6 and 7, higher order offsets (i.e., N>4) can be used to address both image response and harmonic mixing.

Figure 6:
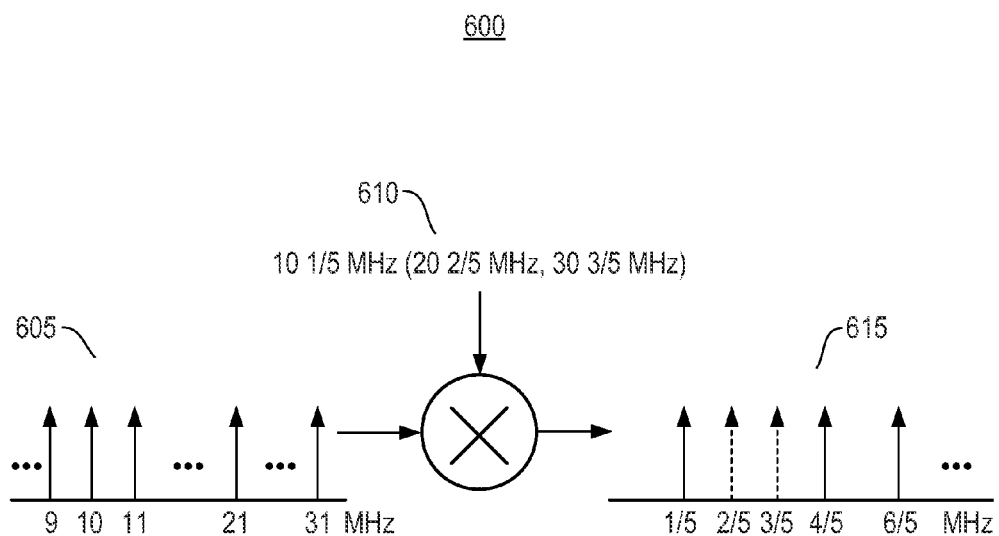
FIG. 6 is a diagram illustrating a method of downconverting a comb spectrum according to another representative embodiment.

FIG. 6 illustrates a method of downconverting a comb spectrum according to another representative embodiment. In this embodiment, the downconversion is performed by mixing the comb spectrum with an LO signal having a frequency offset equal to ⅕ of the frequency spacing interval of the comb spectrum, Referring to FIG. 6, a frequency mixer 600 receives an input comb spectrum 605 and mixes it with an LO signal 610 to produce an output comb spectrum 615. Input comb spectrum 605 is substantially the same as input comb spectrum 405 of FIG, 4, but LO signal 610 differs from LO signal 410 in that it has a frequency offset of ⅕ MHz relative to input comb spectrum 605. In addition, LO signal 610 is shown with its harmonic components in parentheses to indicate that frequency mixer 600 has a harmonic response and it produces mixing products based on these harmonic components. In other words, although frequency mixer 600 is driven by an LO signal of 10 ⅕ MHz, its harmonic response makes it behave as if it were also being driven by 20 ⅖ and 30 ⅗ MHz. Moreover, although FIG. 6 shows only the second and third harmonics 20 ⅖ and 30 ⅗, frequency mixer 600 may also produce mixing products based on higher order harmonics.

Due to the ⅕ frequency offset, the lower sideband responses of frequency mixer 600 have the form X ⅕, where X is an integer. For example, the lower sideband responses include frequency components at ⅕ MHz, 1 ⅕ MHz, 2 ⅕ MHz, and so on. On the other hand, the upper sideband responses of frequency mixer 600 have the form X ⅘, where X is an integer. For example, the upper sideband responses include frequency components at ⅘ MHz, 1 ⅘ MHz, 2 ⅘ MHz, and so on.

The second and third harmonic mixing products of LO signal 610 are of the form X ⅖ or X ⅗, depending on the sideband. For example, the second harmonic 20 ⅖ produces mixing products of the form X ⅖ for its lower sideband signals, and it produces mixing products of the form X ⅗ for its upper sideband signals. Similarly, the third harmonic 30 ⅗ produces mixing products of the form X ⅗ for its lower sideband signals, and it produces mixing products of the form X ⅖ for its upper sideband signals. The mixing products of the second and third harmonics are shown in FIG. 6 by dotted arrows to distinguish them from the mixing products of LO signal 610 and to indicate that they overlap each other.

Because the mixing products of the second and third harmonics appear on different IF frequencies from the mixing products of LO signal 610, they do not interfere with the downconversion of input comb spectrum 605 and can therefore be ignored. Moreover, the 1/5 frequency offset eliminates a need for a preselector to reject signals at frequencies high enough to produce mixing at the second and third harmonics. Accordingly, a preselector may be required merely to reject signals at high enough frequencies to produce mixing at the fourth and higher harmonics.

Figure 7:
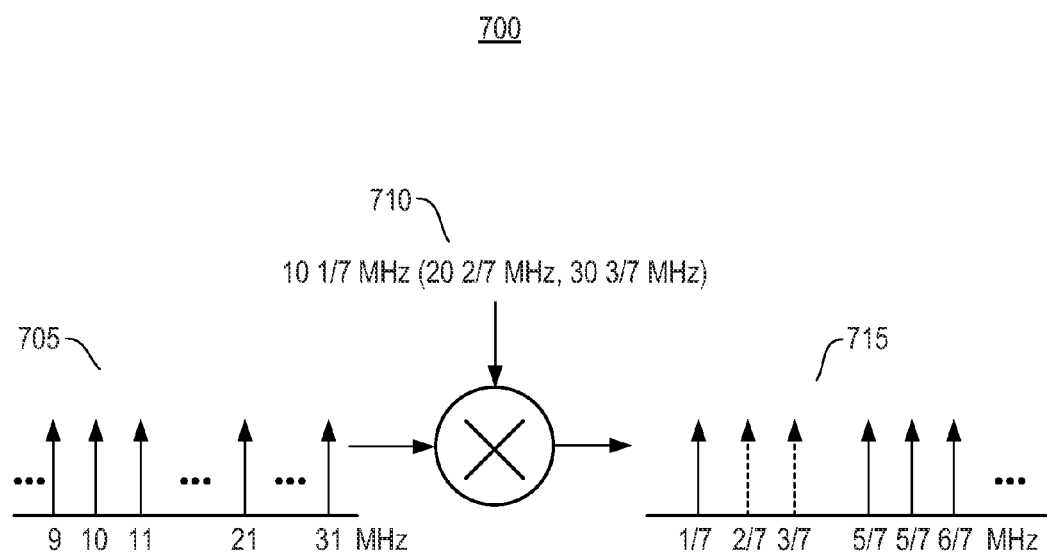
FIG. 7 is a diagram illustrating a method of downconverting a comb spectrum according to another representative embodiment.

FIG. 7 illustrates a method of downconverting a comb spectrum according to another representative embodiment. In this embodiment, the downconversion is performed by mixing the comb spectrum with an LO signal having a frequency offset equal to 1/7 of the frequency spacing interval of the comb spectrum.

Referring to FIG. 7, a frequency mixer 700 receives an input comb spectrum 705 and mixes it with an LO signal 710 to produce an output comb spectrum 715. Input comb spectrum 705 is substantially the same as input comb spectrum 405 of FIG. 5, but LO signal 710 differs from LO signal 410 in that it has a frequency offset of 1/7 MHz relative to input comb spectrum 705. In addition, LO signal 710 is shown with its harmonic components in parentheses to indicate that frequency mixer 700 has a harmonic response and it produces mixing products based on these harmonic components. Although FIG. 7 shows only the second and third harmonics (20 2/7 and 30 3/7), frequency mixer 700 may also produce mixing products based on higher order harmonics.

Due to the 1/7 frequency offset, the lower sideband responses of frequency mixer 700 have the form X 1/7, where X is an integer. For example, the lower sideband responses include frequency components at 1/5 MHz, 1 1/7 MHz, 2 1/7 MHz, and so on. On the other hand, the upper sideband responses of frequency mixer 700 have the form X 6/7, where X is an integer, For example, the upper sideband responses include frequency components at 6/7 MHz, 1 6/7 MHz, 2 6/7 MHz, and so on.

The second harmonic mixing products are of the form X 2/7 or X 5/7, depending on the sideband. For example, the second harmonic 20 2/7 produces mixing products of the form X 2/7 for its lower sideband signals, and it produces mixing products of the form X 5/7 for its upper sideband signals.

The third harmonic mixing products are of the form X 3/7 or X 4/7, depending on the sideband. For example, the third harmonic 30 3/7 produces mixing products of the form X 3/7 for its lower sideband signals, and it produces mixing products of the form X 4/7 for its upper sideband signals.

Although not shown in FIG. 7, the 1/7 frequency offset also prevents the mixing products of the fourth and fifth order harmonics 40 4/7 and 50 5/7 from interfering with the mixing products of LO signal 710. Accordingly, the 1/7 frequency offset eliminates a need for a preselector that filters out frequencies that may mix with these higher order harmonics.

In the examples of FIGS. 4-6, harmonic mixing may be viewed as an undesirable behavior of a mixer because it maps more than one input frequency to the same output frequency. However, for frequency offsets of order 1/7 and higher, harmonic mixing can be harnessed to get "free" additional frequency coverage. For example, with respect to the second harmonic 20 2/7, lower and upper sideband signals 20 and 21 can be downconverted to respective IF frequencies 2/7 and 5/7. Accordingly, through the use of higher order frequency offsets, a larger range of input comb spectrum 705 can be downconverted to a smaller range of output comb spectrum 715.

As described in relation to FIG. 4, any frequency offset of the form M/N (M<N) can be used to improve the characteristics of a frequency mixer. Accordingly, in the examples of FIGS. 5-7, frequency offsets of the form M/3, M/5, and M/7 could be used to avoid image response and/or harmonic mixing, as described above. In addition, higher order offsets such as 1/9, 1/11, or more generally M/9 or M/11 could similarly be used to address image response and harmonic mixing.

As indicated by the foregoing, the frequency offset of a mixer drive signal can be adjusted to address the problems of image response and harmonic mixing in the mixer. Although it is theoretically possible to generate the drive signal with any arbitrary frequency offset, in practice it may be more difficult to generate the drive signal with certain frequency offsets compared to others. For example, a drive signal with a frequency X 1/7 may be much more difficult to generate than a drive signal with a frequency (X+1) 1/7. Accordingly, it may be beneficial to select the overall frequency of the drive signal according to the characteristics of available frequency synthesis techniques, in addition to the desired image response and harmonic mixing characteristics.

Figure 8:
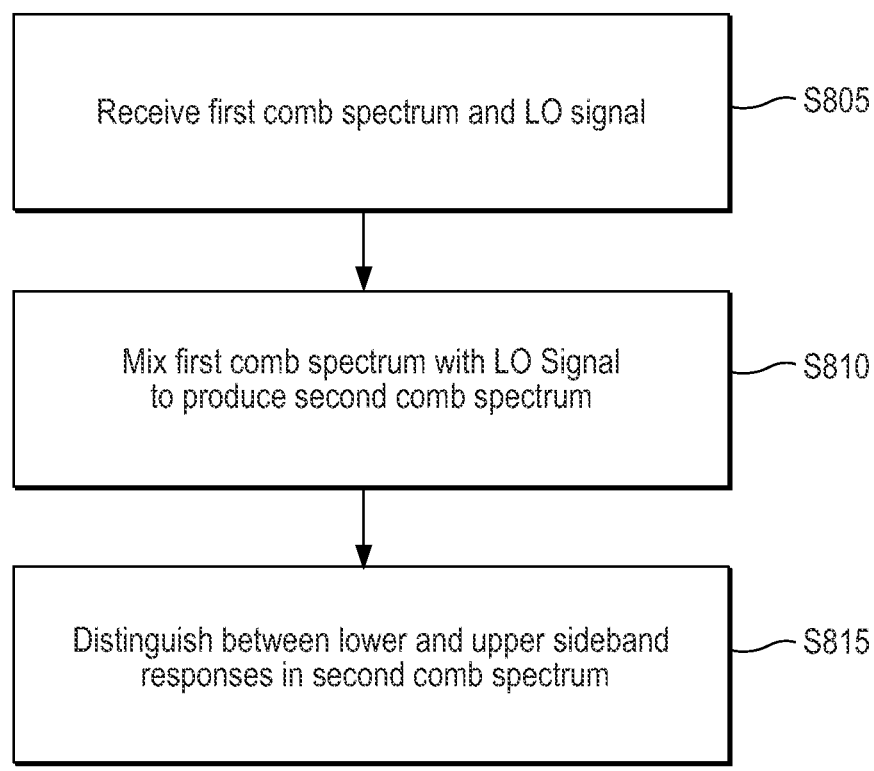
FIG. 8 is a flowchart illustrating a method of downconverting a comb spectrum according to a representative embodiment.

FIG. 8 illustrates a method of downconverting a comb spectrum according to a representative embodiment. The method of FIG. 8 can be applied generally to the frequency mixers illustrated in FIGS. 4 through 7.

Referring to FIG. 8, the method comprises receiving a first comb spectrum and an LO signal (S805). The first comb spectrum can comprise, for example, a plurality of frequency components separated from each other according to a frequency spacing interval. For instance, it can comprise any of input comb spectra 405 through 705, which are separated from each other according to a 1 MHz frequency spacing interval. The LO signal has a frequency offset relative to the first comb spectrum, wherein the frequency offset is approximately M/N times the frequency spacing interval, N is an integer greater than two, and M is a positive integer less than N. For example, if M equals one and N equals three, four, five or seven, the frequency offset can be set to 1/4, 1/3, 1/5, or 1/7 as in FIGS. 4 through 7.

The method further comprises mixing the first comb spectrum with the LO signal to generate a second comb spectrum (S810). The second comb spectrum comprises lower and upper sideband responses corresponding to respective lower and upper sideband signals of the first comb spectrum. Finally, the method comprises distinguishing between the lower and upper sideband responses in the second comb spectrum based on the frequency offset (S815). In the example of FIG. 6, for instance, this can be accomplished by identifying the frequencies at offsets X 1/5 as the lower sideband responses, and identifying the frequencies at offsets X 4/5 as the upper sideband responses.

In some embodiments, the method further comprises generating a downconverted comb spectrum by recovering the lower and upper sideband responses from the second comb spectrum and rejecting harmonic responses included in the second comb spectrum. This can be accomplished, for instance, by a signal analysis circuit in a network analyzer as illustrated in FIG. 1. Moreover, in some embodiments, such as those where N is greater than or equal to seven, the method may further comprise generating the downconverted comb spectrum by recovering the lower and upper sideband responses from the second comb spectrum, and further recovering harmonic responses in the second comb spectrum, as explained, for instance, in the description of FIG. 7.

Figure 9:
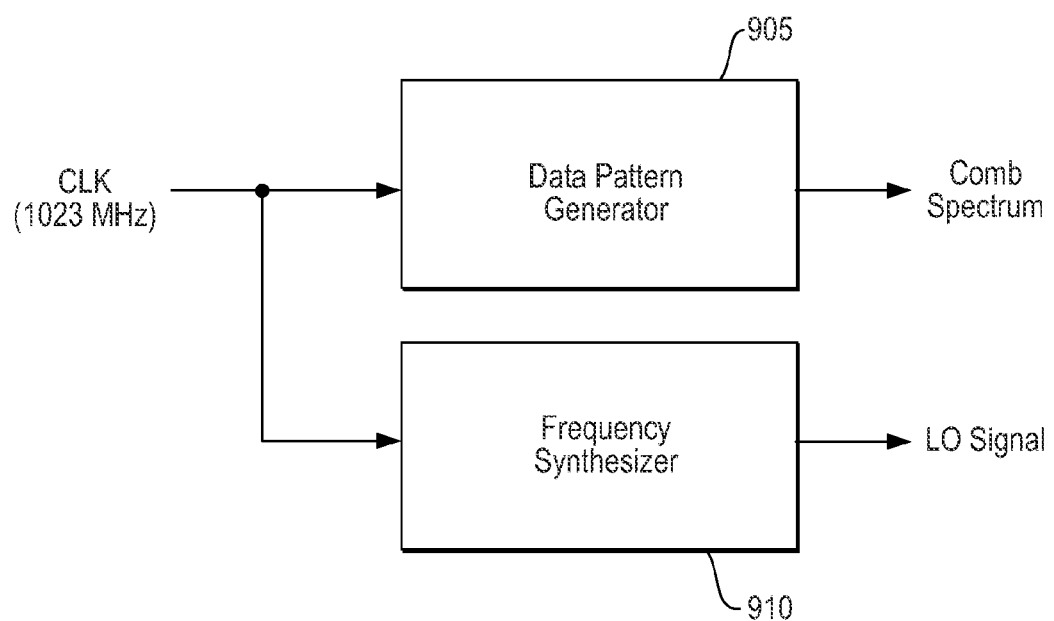
FIG. 9 is a diagram illustrating a system that generates a comb spectrum and a mixer drive signal according to a representative embodiment.

FIG. 9 illustrates a system 900 that generates a comb spectrum and an LO drive signal according to a representative embodiment. These signals can both be from a common signal, in this example, a clock signal. As described below, a first signal (e.g., the clock signal) can be divided by an integer N to produce a second signal with a second frequency 1/N times the first frequency, and the second signal can then be multiplied by an integer K to produce a third signal with a third frequency K/N times the first frequency. The third signal can be used as the LO drive signal with a frequency offset of M/N relative to the comb spectrum.

Referring to FIG. 9, system 900 comprises a data pattern generator 905 and a frequency synthesizer 910 that operate according to a clock signal CLK. In this example, it is assumed that clock signal CLK has a clock frequency $f_{clk}$=1023 MHz. However, system 900 is not limited to this particular frequency.

Data pattern generator 905 comprises a pseudo-random binary sequence (PRBS) generator that generates a maximal length PRBS with a pattern length B (in bits). The PRBS forms a comb spectrum with approximately equal power at each frequency that is significantly below the clock frequency.

A ratio of clock frequency $f_{CLK}$ to a lowest frequency component $f_0$ of the comb spectrum is equal to pattern length 13, as illustrated by the following equation B=$f_{CLK}$/$f_0$. Pattern length B is constrained to $2^n-1$, where n is an integer. For instance, B can be equal to 127 ($2^7-1$), 511 ($2^9-1$), 1023 ($2^{10}-1$), or 8191 ($2^{12}-1$).

In the example of FIG. 9, it is assumed that pattern length B is 1023 and clock frequency $f_{CLK}$ is 1023 MHz. Accordingly, B=1023=1023 MHz/$f_0$, and $f_0$ is equal to 1 MHz, Therefore the comb frequencies of the comb spectrum will be the harmonics of $f_0$, i.e., 1 MHz, 2 MHz, 3 MHz, etc, Roughly equal power will be available at frequencies up to around 500 MHz.

Frequency synthesizer 910 generates an LO signal to drive a frequency mixer to downconvert the comb spectrum produced by data pattern generator 905. For explanation purposes, it will be assumed that the LO signal (or mixer drive signal) has a frequency near 440 MHz to reduce the 380 to 500 MHz band to zero to 60 MHz. A number of possible frequencies can be used for the LO signal, with a frequency offset of $1/7$ MHz, For example, any of the following frequencies could be used as the LO signal for the downconversion: 338 $1/7$ MHz, 339 $1/7$ MHz, 400 $1/7$ MHz, 401 $1/7$ MHz, etc, Similarly, any of the following frequencies would work as well: 400 $2/7$, 400 $3/7$, 400 $4/7$, 400 $5/7$, and 400 $6/7$.

Some of these frequencies may be difficult to synthesize using clock signal CLK with clock frequency $f_{CLK}$=1023 MHz. As an example, one way to generate the drive signal with the frequency 400 $2/7$ MHz is to divide 1023 MHz by 7161 to produce $1/7$ MHz (about 142 kHz) and then use a phase lock loop (PLL) multiplier to multiply by some large integer such as 2802 to get 400 $2/7$ MHz. Unfortunately, this tends to result in poor phase noise. Moreover, frequency synthesizer 810 would have to be reprogrammed if pattern length B were to be changed to say 8191. The reason for increasing pattern length B would be to get better frequency resolution on account of closer frequency spacing.

Figure 10:
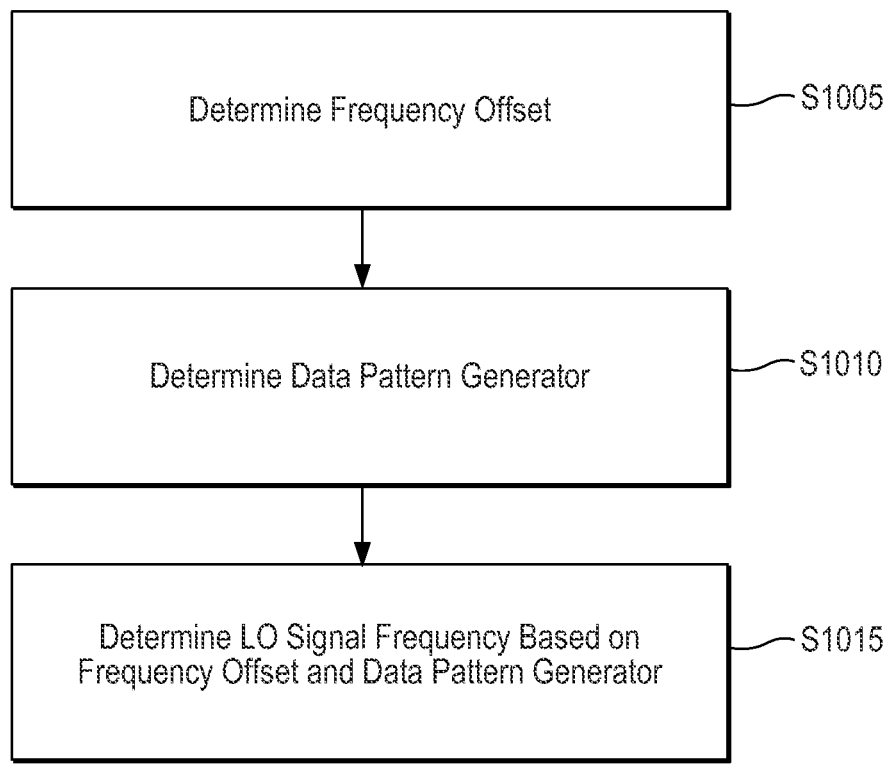
FIG. 10 is a flowchart illustrating a method for determining a frequency of a mixer drive signal according to a representative embodiment.

FIG. 10 illustrates a method for determining a frequency of an LO signal according to a representative embodiment. For explanation purposes, it will be assumed that this method is performed by system 900 of FIG, 9. This method may simplify the process of frequency synthesis for LO signals having fractional frequency offsets such as $1/7$. Moreover, this method can identify frequencies independent of pattern length B and it may be simpler than conventional methods of frequency synthesis.

Referring to FIG. 10, the method determines a frequency offset to be applied to the LO signal (S1005). For instance, the frequency offset may be determined as $1/7$ in order to address image response and harmonic mixing as described above. The method also determines characteristics of data pattern generator 905, including its clock frequency fcrx. (S1010). For example, the frequency may be determined to be 1023 MHz as in FIG. 9. Finally, the method determines the frequency of the LO signal based on the determined frequency offset and the clock frequency $f_{CLK}$ (S1015), This can be accomplished by multiplying the clock frequency $f_{CLK}$ by a rational fraction of the form K/Nf (e.g., K/7), where K is a relatively small integer not equal to N, e.g., an integer less than 2 or 3 times N. Such fractions may include, e.g., $6/7$, $8/7$, $9/7$, $10/7$, $15/7$. As an example, the frequency of the LO signal can be determined by multiplying clock frequency $f_{CLK}$ by $8/7$, which results in an LO signal of 1,169 $1/7$ MHz.

Once the frequency of the LO signal has been determined according to the method of FIG. 10, frequency synthesizer 910 synthesizes the LO signal with the frequency and outputs the LO signal to a frequency mixer such as that illustrated in FIG. 7. This can be accomplished, for instance, by dividing the clock frequency f<CLK by N and then multiplying it by K.

One potential benefit of the method of FIG. 10 is that it identifies frequencies that can be readily synthesized by frequency synthesizer 810. For example, it may be difficult to produce an offset of $1/7$ relative to any arbitrary frequency, as this may require dividing the clock signal $f_{CLK}$ by a large number and then multiplying the divided frequency back up. In FIG. 9, for instance, the clock frequency $f_{CLK}$ would be divided by 1023*7 (i.e., 7161) to produce a signal with a $1/7$ MHz frequency. This signal would then need to be multiplied by some large number to produce the LO signal with the desired frequency. By contrast, the method of FIG. 10 can reduce the number of divisions and multiplications. Another potential benefit of the method of FIG. 10 is that it allows the LO signal to be generated with different frequencies independent of pattern length B. This may eliminate a need to reprogram frequency synthesizer 915 based on changes to pattern length B.

To further illustrate the above benefits, suppose down conversion is performed by driving a frequency mixer with a fractional offset of $3/7$ of 1023 MHz (e.g., 438 $3/7$ MHz), In this example, "$3/7$ offset" downconversion will occur, which is similar to $1/7$ offset downconversion, It may he easier to synthesize the frequency 348 $3/7$ by dividing 1023 MHz by 7, resulting in 146 $1/7$ MHz, then multiplying that by 3 to get 438 $3/7$ MHz. If the pattern length is changed to 8191, the spacing of the comb spectrum decreases from 1 MHz to approximately 125 kHz. The $3510^{th}$ harmonic of this frequency is 438.375 MHz. This differs from 438 $3/7$ by about 0.053 MHz, which is $3/7$ of the comb frequency spacing of approximately 125 kHz. Thus the offset is $3/7$, the same as before. It can be shown that this works for any pattern length that is not divisible by 7. Other ratios such as $4/7$, $5/7$, $6/7$, $8/7$, $9/7$, $10/7$, etc. can be used to get additional frequency coverage. If it is important to use a pattern length that is divisible by 7, such as 4095, it is possible to use a different frequency offset, such as $1/11$ offset, which works for any pattern length that is not divisible by 11.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:
1. A method comprising:
receiving a first comb spectrum comprising a plurality of frequency components separated from each other according to a frequency spacing interval;

receiving a local oscillator (LO) signal having a frequency offset relative to the first comb spectrum, wherein the frequency offset is a rational fraction of the frequency spacing interval and is less than one;

mixing the first comb spectrum with the LO signal to generate a second comb spectrum, wherein the second comb spectrum comprises lower and upper sideband responses corresponding to respective lower and upper sideband signals of the first comb spectrum; and distinguishing between the lower and upper sideband responses in the second comb spectrum based on the frequency offset.

2. The method of claim 1, further comprising generating a test comb spectrum to excite a device under test (DUT), and receiving the first comb spectrum as a response comb spectrum from the DUT.

3. The method of claim 1, further comprising generating a downconverted comb spectrum by recovering the lower and upper sideband responses from the second comb spectrum and rejecting harmonic responses included in the second comb spectrum.

4. The method of claim 1, wherein the frequency offset is M/N times the frequency spacing interval, N is an integer greater than two, and M is a positive integer less than N.

5. The method of claim 3, wherein the rational fraction is a multiple of ⅕ and the rejected harmonic responses include mixing products of second and third order harmonics of the LO signal.

6. The method of claim 4, wherein N is greater than or equal to seven, and the method further comprises generating a downconverted comb spectrum by recovering the lower and upper sideband responses from the second comb spectrum, and further recovering harmonic responses in the second comb spectrum.

7. The method of claim 6 wherein the recovered harmonic responses comprise mixing products of second and third order harmonics of the LO signal.

8. The method of claim 4, further comprising:

receiving a clock signal of a pseudo-random binary sequence (PRBS) generator used to generate the first comb spectrum, wherein the clock signal has a first frequency, and the first comb spectrum has a frequency component corresponding to the first frequency divided by a pattern length of the PRBS; and generating the LO signal with a second frequency equal to K/N times the first frequency, wherein K is a positive integer not equal to N and the pattern length of the PRBS is not a multiple of K.

9. The method of claim 8, wherein generating the LO signal with a second frequency equal to K/N times the first frequency comprises:

dividing the clock signal by N to produce a divided signal with a frequency 1/N times the first frequency: and multiplying the divided signal by K to generate the LO signal with a third frequency K/N times the first frequency.

10. The method of claim 8, wherein K is greater than N.

11. The method of claim 8, wherein the frequency component is a lowest frequency component of the first comb spectrum.

12. A system, comprising:

a downconverter configured to mix a first comb spectrum and a local oscillator (LO) signal to produce a second comb spectrum, wherein the first comb spectrum is characterized by a frequency spacing interval, the LO signal has a frequency offset relative to the first comb spectrum, where the frequency offset is a rational fraction of the frequency spacing interval and is less than one, and the second comb spectrum comprises lower and upper sideband responses corresponding to respective lower and upper sideband signals of the first comb spectrum; and a signal analysis circuit configured to distinguish between the lower and upper sideband responses of the second comb spectrum based on the frequency offset.

13. The system of claim 12, wherein the downconverter comprises a frequency mixer for a superheterodyne receiver.

14. The system of claim 12, wherein the frequency offset is approximately M/N times the frequency spacing interval, N is an integer greater than two, and M is a positive integer less than N.

15. The system of claim 12, further comprising a network analyzer configured to generate a test comb spectrum to excite a device under test (DUT), wherein the first comb spectrum is output by the DUT in response to the test comb spectrum.

16. The system of claim 14, further comprising:

a pseudo-random binary sequence (PRBS) generator configured to receive a clock signal and to generate the first comb spectrum based on a frequency of the clock signal; and a frequency synthesizer configured to generate the LO signal with a frequency K/N times the frequency of the clock signal, wherein K is a positive integer not equal to N and the PRBS has a pattern length that is not a multiple of K.

17. The system of claim 16, wherein the frequency synthesizer is configured to divide the clock signal by N to produce a signal having a frequency 1/N times the frequency of the clock signal, and to multiply the signal by K to generate the LO signal with the frequency K/N times the frequency of the clock signal.

18. The system of claim 14, wherein N is greater than or equal to seven, and the signal analysis circuit is configured to generate a downconverted comb spectrum by recovering the lower and upper sideband responses from the second comb spectrum, and further recovering harmonic responses in the second comb spectrum.

19. The system of claim 12, wherein the signal analysis circuit is configured to generate a downconverted comb spectrum by recovering the lower and upper sideband responses from the second comb spectrum and rejecting harmonic responses included in the second comb spectrum.

20. The system of claim 19, wherein the rejected harmonic responses comprise mixing products of second and third order harmonics of the LO signal.

* * * * *

UNITED STATES PATENT AND TRADEMARK OFFICE
CERTIFICATE OF CORRECTION

PATENT NO. : 8,718,590 B2
APPLICATION NO. : 13/712262
DATED : May 6, 2014
INVENTOR(S) : Richard K. Karlquist Page 1 of 1

It is certified that error appears in the above-identified patent and that said Letters Patent is hereby corrected as shown below:

In the Specification

In column 1, line 10, delete "2012," and insert -- 2012. --, therefor.

Signed and Sealed this
Nineteenth Day of August, 2014

Michelle K. Lee
*Deputy Director of the United States Patent and Trademark Office*